United States Patent
Yeo et al.

(10) Patent No.: US 10,317,447 B2
(45) Date of Patent: Jun. 11, 2019

(54) PASSIVE INTERMODULATION MEASUREMENT DEVICE AND RELAY UNIT INCLUDING THE SAME

(71) Applicant: SOLiD, INC., Seongnam-si (KR)

(72) Inventors: Yeong Shin Yeo, Gwangmyeong-si (KR); Kyung Eun Han, Suwon-si (KR)

(73) Assignee: SOLiD, INC., Seongnam-si (KR)

( * ) Notice: Subject to any disclaimer, the term of this patent is extended or adjusted under 35 U.S.C. 154(b) by 0 days.

(21) Appl. No.: 15/865,749

(22) Filed: Jan. 9, 2018

(65) Prior Publication Data

US 2018/0128865 A1    May 10, 2018

Related U.S. Application Data

(63) Continuation of application No. 14/583,558, filed on Dec. 26, 2014, now Pat. No. 9,897,638, which is a
(Continued)

(30) Foreign Application Priority Data

Nov. 25, 2013    (KR) .................. 10-2013-0143572

(51) Int. Cl.
*G01R 23/00*    (2006.01)
*G01R 23/02*    (2006.01)
(Continued)

(52) U.S. Cl.
CPC ............. *G01R 29/10* (2013.01); *G01R 23/20* (2013.01)

(58) Field of Classification Search
CPC ........ G01R 23/00; G01R 23/02; G01R 31/08; G01R 21/00; H04W 24/08; H04W 24/10; H04B 7/26

See application file for complete search history.

(56) References Cited

U.S. PATENT DOCUMENTS

| 6,144,692 | A | 11/2000 | Beck |
| 2010/0164504 | A1 | 7/2010 | Bradley |

(Continued)

FOREIGN PATENT DOCUMENTS

| KR | 10-2006-0116185 A | 11/2006 |
| KR | 10-2007-0015100 A | 2/2007 |
| KR | 10-2008-0086604 A | 9/2008 |
| KR | 10-2011-0071722 A | 6/2011 |
| KR | 10-1136994 B1 | 4/2012 |

OTHER PUBLICATIONS

Office Action issued in parent U.S. Appl. No. 14/583,558 dated Oct. 6, 2016.
(Continued)

*Primary Examiner* — Neel D Shah
(74) *Attorney, Agent, or Firm* — Sughrue Mion, PLLC

(57) ABSTRACT

A passive intermodulation (PIM) measurement device for measuring a PIM in at least one of installation equipments and a distribution network within a distributed antenna system (DAS), the PIM measurement device included in a relay unit of the DAS the PIM measurement device includes a pulse generation unit a PIM detection unit and a controller. The pulse generation unit generates a two-tone pulse signal having frequencies different from each other. The PIM detection unit detects intermodulation (IM) signals fed back from the installation equipments or the distribution network in the DAS corresponding to the propagation of the two-tone pulse signal. The controller detects PIM generation information in the DAS based on the fed-back IM signal.

19 Claims, 7 Drawing Sheets

Related U.S. Application Data continuation-in-part of application No. PCT/KR2013/011899, filed on Dec. 19, 2013.

(51) Int. Cl.
| | | |
|---|---|---|
| *G01R 31/08* | (2006.01) | |
| *G01R 21/00* | (2006.01) | |
| *H04B 7/26* | (2006.01) | |
| *H04W 24/08* | (2009.01) | |
| *H04W 24/10* | (2009.01) | |
| *G01R 29/10* | (2006.01) | |
| *G01R 23/20* | (2006.01) | |

(56) References Cited

U.S. PATENT DOCUMENTS

| | | |
|---|---|---|
| 2010/0295533 A1 | 11/2010 | Kuga et al. |
| 2014/0153418 A1 | 6/2014 | Hariharan et al. |
| 2017/0230129 A1* | 8/2017 | Yoo .................. H04W 24/06 |

OTHER PUBLICATIONS

Office Action issued in parent U.S. Appl. No. 14/583,558 dated May 11, 2017.
Notice of Allowance issued in parent U.S. Appl. No. 14/583,558 dated Oct. 6, 2017.
International Search Report for PCT/KR2013/011899.

* cited by examiner

PASSIVE INTERMODULATION MEASUREMENT DEVICE AND RELAY UNIT INCLUDING THE SAME

CROSS-REFERENCE TO RELATED APPLICATIONS

The present application is a continuation of U.S. application Ser. No. 14/583,558, filed on Dec. 26, 2014, which is a continuation-in-part application to International Application No. PCT/KR2013/011899 with an International Filing Date of Dec. 19, 2013, which claims the benefit of Korean Patent Application No. 10-2013-0143572 filed in the Korean Intellectual Property Office on Nov. 25 2013 the entire contents of which are incorporated herein by reference.

BACKGROUND

1. Technical Field

The inventive concept relates to a distributed antenna system (DAS) and more particularly to a passive intermodulation (PIM) measurement device for measuring a PIM in a distribution network or/and installation equipments within a DAS, and a relay unit including the PIM measurement device.

2. Background Art

Passive intermodulation (PIM) is a spurious signal generated by nonlinear characteristics of a passive element and refers to a phenomenon in which the signal-to-noise characteristic is deteriorated on a communication path thereby degrading communication quality. PIM characteristics in equipments of a distributed antenna system (DAS) are maintained to have a predetermined quality or more in production of the equipments, but a problem of PIM may occur in a field due to a passive element used in a distribution network from the rear end of an antenna port of a remote unit to a final antenna. In a conventional DAS, when a problem of PIM problem occurs in the field, it is very difficult to detect an exact occurrence position, a cause and the like of the PIM. Therefore, it is necessary to develop a plan for enabling a PIM to be measured in a DAS.

SUMMARY

An embodiment of the inventive concept is directed to a passive intermodulation (PIM) measurement device for measuring a PIM in a distribution network or/and installation equipments within a distributed antenna system (DAS), and a relay unit including the PIM measurement device.

According to an aspect of the inventive concept, a passive intermodulation (PIM) measurement device for measuring a PIM in at least one of installation equipments and a distribution network within a distributed antenna system (DAS), the PIM measurement device included in a relay unit of the DAS, the PIM measurement device includes: a pulse generation unit configured to generate a two-tone pulse signal having frequencies different from each other; a PIM detection unit configured to detect intermodulation (IM) signals fed back from the installation equipments or the distribution network in the DAS, corresponding to the propagation of the two-tone pulse signal; and a controller configured to detect PIM generation information in the DAS, based on the fed-back IM signal.

The pulse generation unit may include a first test signal generator configured to generate a continuous wave having a first frequency; a first on/off switch configured to receive the continuous wave having the first frequency, input from the first test signal generator, and change the received continuous wave into a pulse signal; a second test signal generator configured to generate a continuous wave having a second frequency different from the first frequency; and a second on/off switch configured to receive the continuous wave having the second frequency, input from the second test signal generator, and change the received continuous wave into a pulse signal.

Each of the first and second test signal generators may be provided with a frequency variable module for enabling the selection of a frequency of a continuous wave to be generated therefrom. The controller may control the first and second test signal generators to generate continuous waves corresponding to two frequencies in a frequency band necessary for PIM measurement, which are selected from the first and second test signal generators, and control the first and second on/off switches so that the continuous waves having the two frequencies are changed into pulse signals at the same time, based on the time when the two-tone pulse signal is propagated.

The controller may measure a time required from the time when the two-tone pulse signal is generated or propagated to the time when the fed-back IM signal is detected, and calculate a distance corresponding to the measured time, thereby identifying a PIM generation position.

The PIM detection unit may detect a signal having a frequency corresponding to the following Equation 1 among the received signals as an IM signal fed back corresponding to the two-tone pulse signal. The controller may decide a PIM characteristic at the PIM generation position based on an IM signal having the largest signal magnitude among the detected IM signals:

$$\text{Frequency of } IM \text{ signal} = Mf_1 \pm Nf_2, \qquad \text{Equation 1}$$

Here, f1 and f2 are frequencies of the two-tone pulse signal, and M and N are natural numbers.

The controller may control the PIM measurement to be performed by propagating the two-tone pulse signal in an idle period where the relay unit having the PIM measurement device included therein does not provide any relay service, or transmit a service pause command to the relay unit so that the relay service is paused during a test period of the PIM measurement according to the two-tone pulse signal.

When the relay unit having the PIM measurement unit included therein provides a multiband service, the controller may control PIM measurements for the frequency bands to be sequentially performed according to a two-tone pulse signal generated suitable for each frequency band of a multiband by controlling operations of the first and second test signal generators, so that the PIM measurement in the distribution network or installation equipments installed in the distribution network is possible for each frequency of the multiband.

The controller may perform PIM measurement when the relay unit having the PIM measurement device included therein provides the relay service. The controller may select two frequencies to be used in the two-tone pulse signal, so that the IM signal to be detected by the PIM detection unit has a frequency not overlapped with a service frequency band used by the relay service according to Equation 1.

According to another aspect of the inventive concept, a relay unit constitutes a DAS, and includes the PIM measurement device having the aforementioned features.

When the relay unit is a donor unit connected to a plurality of remote units, the PIM measurement device may generate a two-tone pulse signal necessary for each remote unit and sequentially transmit the generated two-tone pulse signals to the respective remote units, thereby performing PIM measurement for each remote unit based on an IM signal fed back, so that PIM measurements in an antenna distribution network connected to the plurality of remote units and installation equipments installed in the antenna distribution network are possible.

It should be understood that different embodiments of the invention, including those described under different aspects of the invention, are meant to be generally applicable to all aspects of the invention. Any embodiment may be combined with any other embodiment unless inappropriate. All examples are illustrative and non-limiting.

According to the inventive concept, it is possible to provide a PIM measurement device for measuring a PIM in a distribution network or/and installation equipments within a DAS, and a relay unit including the PIM measurement device.

DETAILED DESCRIPTION

Figure 1:
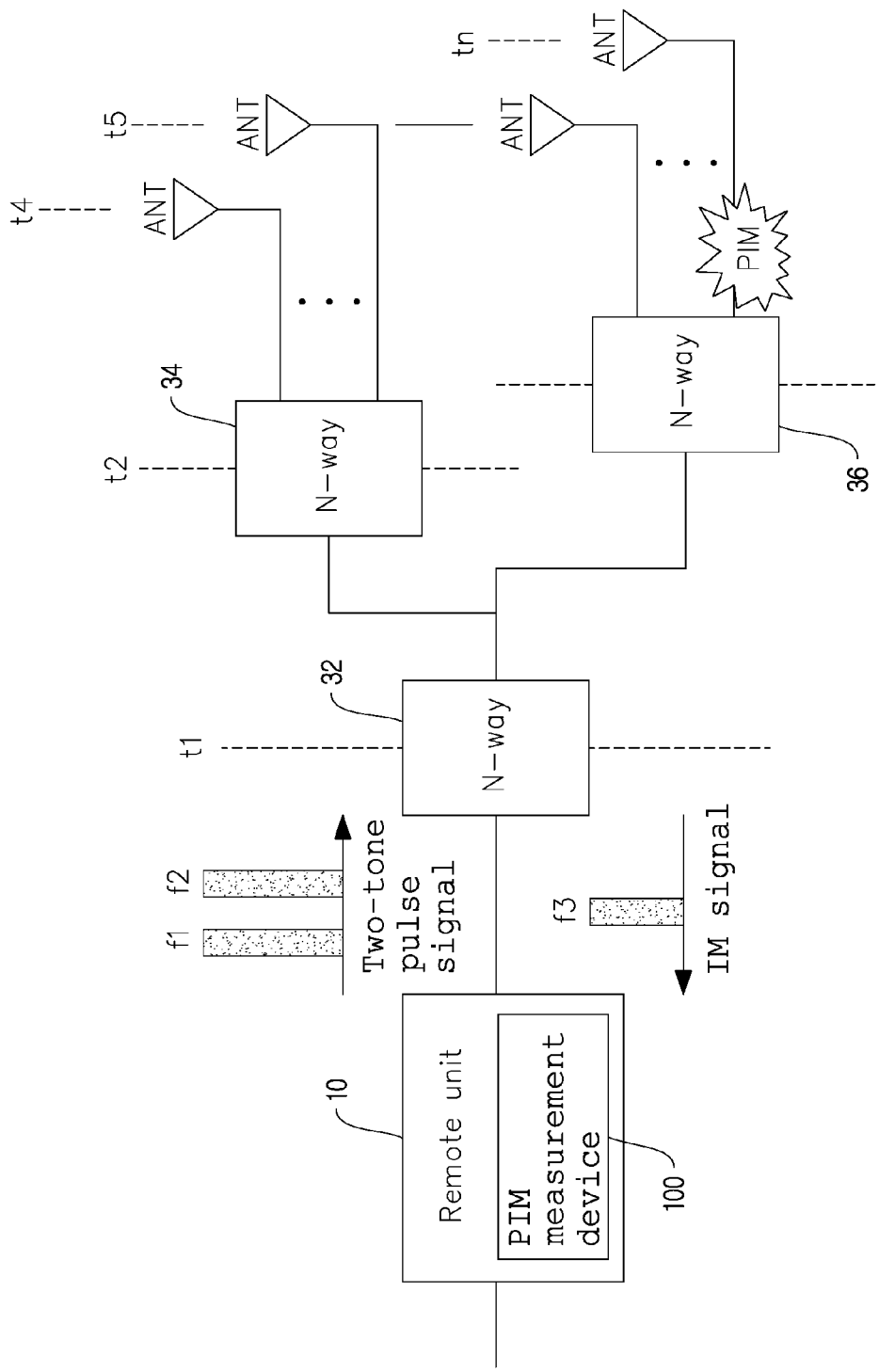
FIG. 1 is a conceptual diagram illustrating a passive intermodulation (PIM) measurement plan applied to a distributed antenna system (DAS) according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Throughout the disclosure, like reference numerals refer to like parts throughout the various figures and embodiments of the inventive concept.

Throughout the description of the inventive concept, when describing a certain technology is determined to evade the point of the inventive concept, the pertinent detailed description will be omitted. Numerals (e.g., first, second, etc.) used in the description of the inventive concept are only for distinguishing one element from another element.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

In detailed description, PIM test signal may be the swithed continuous wave. Furthermore, PIM test signal may be encoded modulating signal for effectively detecting PIM occurrence positon. Here, the encoded modulating signal may be signal corresponding to modulation signal used in mobile communication system such as CDMA, WCDMA.

FIG. 1 is a conceptual diagram illustrating a passive intermodulation (PIM) measurement plan applied to a distributed antenna system (DAS) according to an embodiment of the inventive concept.

Figure 7:
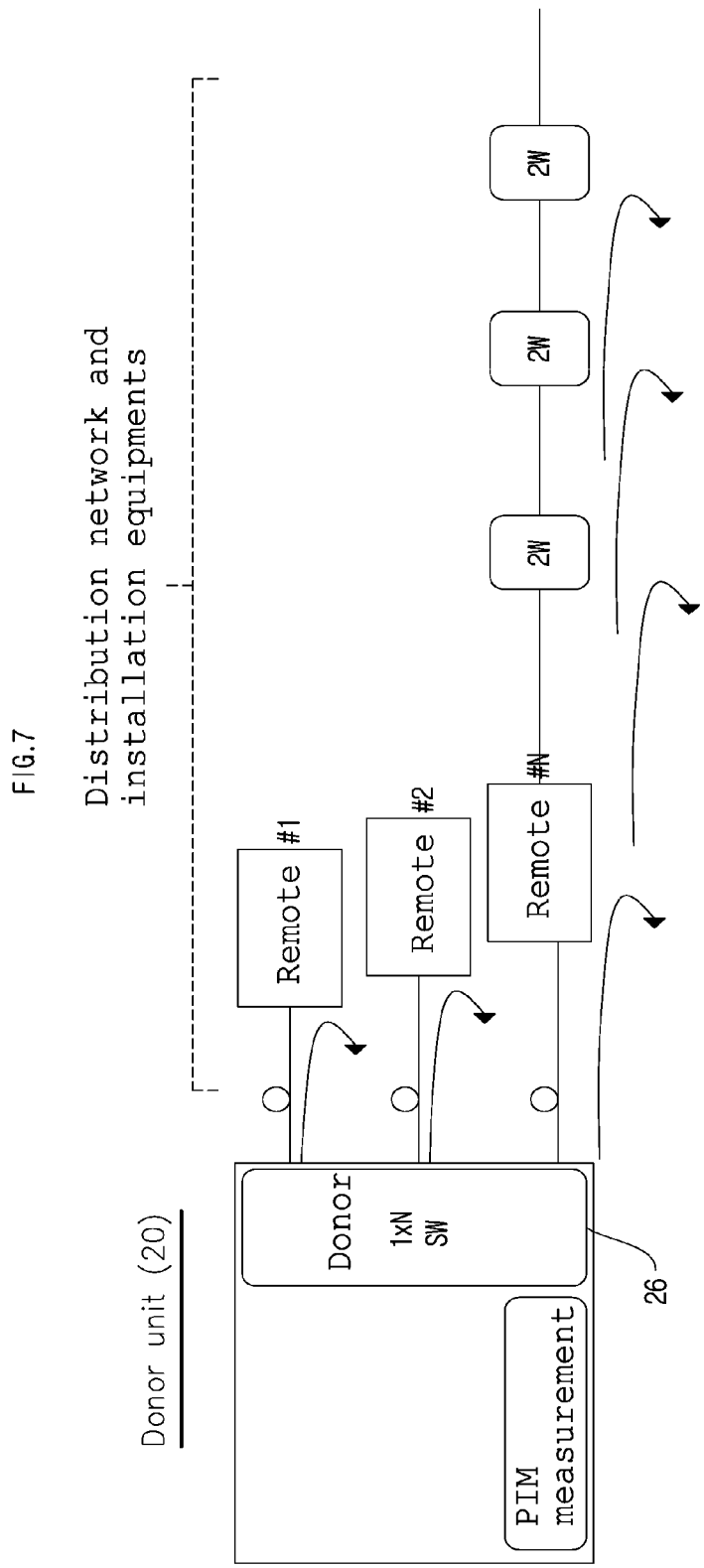
FIG. 7 is an exemplary diagram illustrating a plan for measuring a PIM in a distribution network and installation equipments within the DAS when assuming that the PIM measurement device is included in a donor unit.

Referring to FIG. 1, a DAS is illustrated in which a plurality of antennas ANT are distributed and disposed with respect to one remote unit 10. In this state, signal distributors 32, 34 and 36 are used for signal distribution to the plurality of antennas ANT. In the embodiment of the inventive concept, as shown in FIG. 1, a PIM measurement device 100 is included in a relay unit (In this embodiment, the relay unit is the remote unit 10. However, the relay unit may be a donor unit 20 as shown in FIG. 7 to be described later.) constituting the DAS, to perform measurement of the generation position and characteristic of a PIM in a distribution network in the DAS and various kinds of installation equipments mounted in the distribution network.

The PIM measurement device 100, as shown in FIG. 1, generates a two-tone pulse signal having frequencies f1 and f2 different from each other and transmits the generated two-tone pulse signal to the distribution network and the installation equipments in the DAS. When a PIM is generated at a specific position of the distribution network or/and the installation equipments, an intermodulation (IM) signal fed back from the generation position (This means a position at which a passive element having an inferior PIM characteristic is disposed) of the corresponding PIM is detected, thereby performing PIM measurement. In this state, the feedback time of the IM signal is changed depending on a distance from the remote unit 10 in which the PIM measurement device 100 is included to the generation position of the PIM (see t1 to tn of FIG. 1). Thus, if the corresponding feedback time (i.e., the time required from the time when the two-tone pulse signal is generated or transmitted to the time when the IM signal is received or detected) is measured, information on the generation position of the PIM can be obtained. In addition, the PIM characteristic at the corresponding position may be measured based on the magnitude of the detected IM signal. This will be described in detail hereinbelow with reference to FIGS. 2 and 3.

Figure 2:
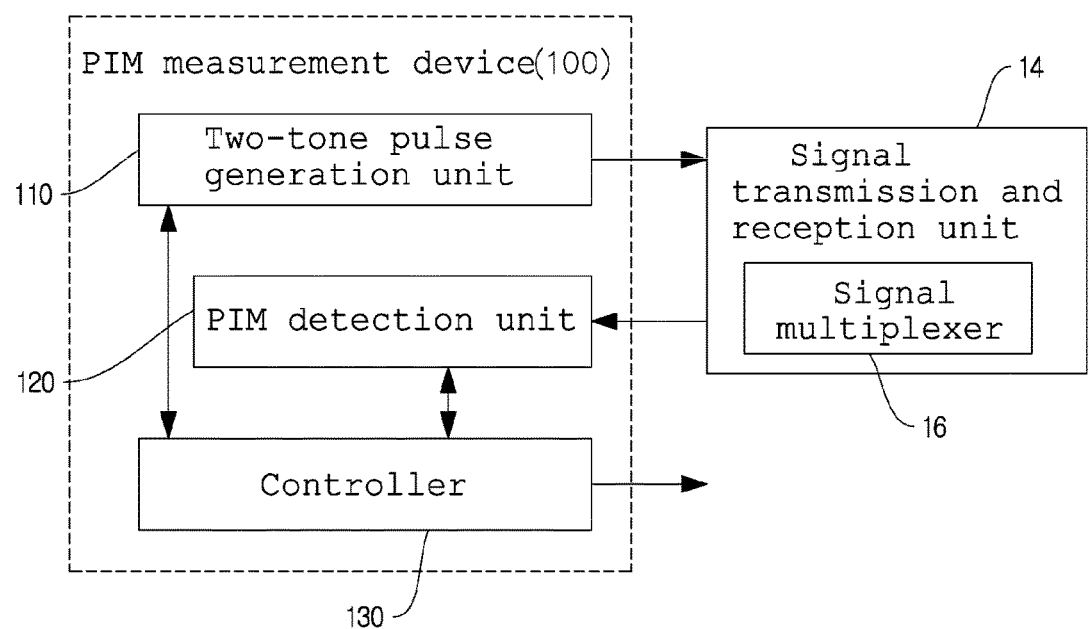
FIG. 2 is a block diagram illustrating a PIM measurement device included in a relay unit according to an embodiment of the inventive concept.
Figure 3:
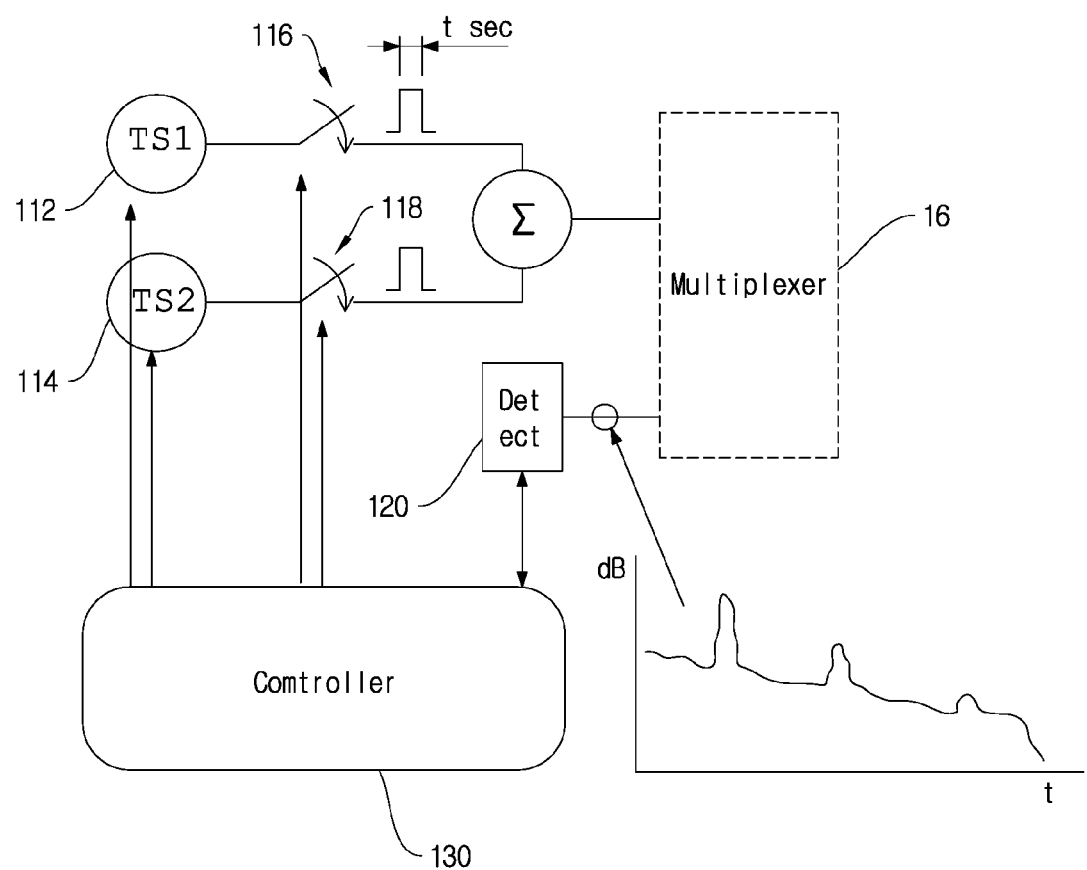
FIG. 3 is a configuration circuit diagram illustrating an embodiment of the PIM measurement device.
Figure 4:
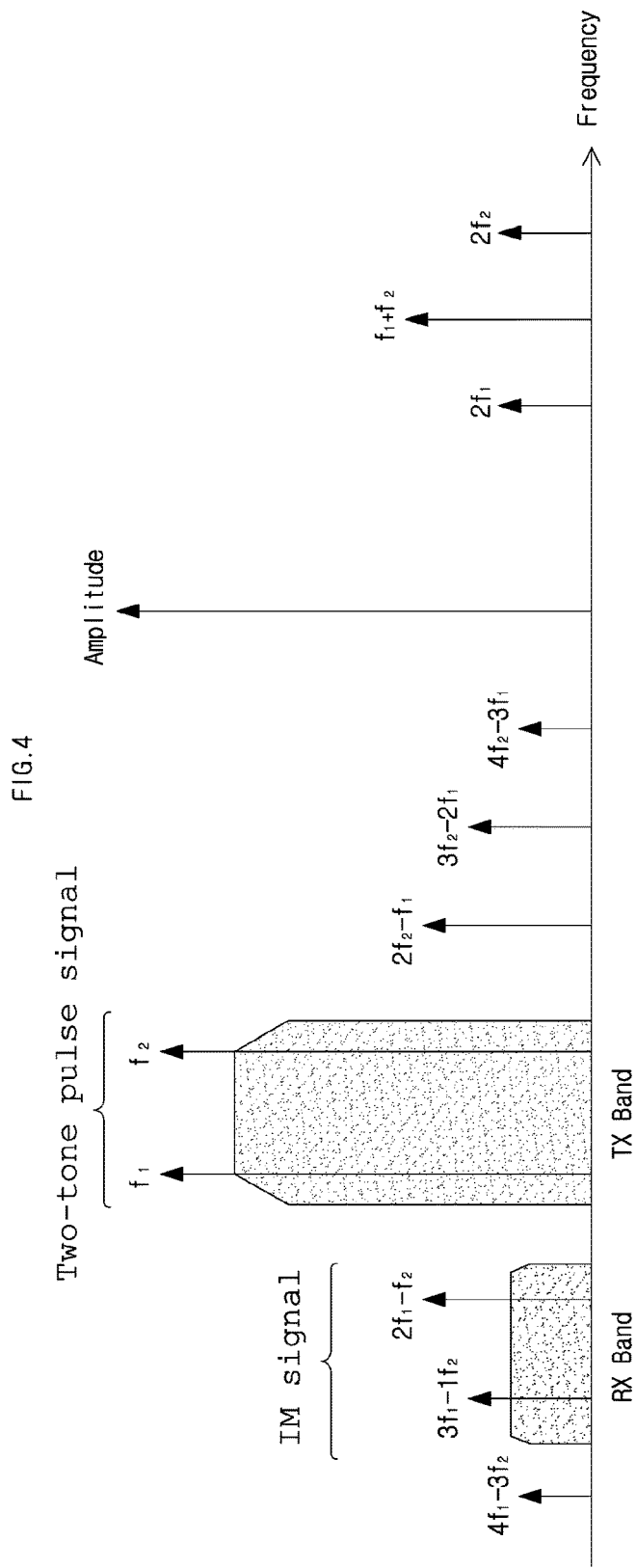
FIG. 4 is an exemplary diagram illustrating the generation frequency band of an intermodulation (IM) signal corresponding to a two-tone pulse signal.

FIG. 2 is a block diagram illustrating a PIM measurement device included in a relay unit according to an embodiment of the inventive concept. FIG. 3 is a configuration circuit diagram illustrating an embodiment of the PIM measurement device. FIG. 4 is an exemplary diagram illustrating the generation frequency band of an IM signal corresponding to a two-tone pulse signal.

Referring to FIG. 2, the PIM measurement device 100 according to the embodiment of the inventive concept may include a two-tone pulse generation unit 110, a PIM detection unit 120 and a controller 130.

The two-tone pulse generation unit 110 generates a two-tone pulse signal having frequencies different from each other. For example, referring to FIG. 3, the two-tone pulse generation unit 110 may be configured to include a first test signal generator 112, a second test signal generator 114, a first on/off switch 116 and a second on/off switch 118.

Here, the first test signal generator 112 generates a continuous wave having a first frequency, and the second test signal generator 114 generates a continuous wave having a second frequency different from the first frequency. In this state, the first and second frequencies may be respectively fixed to previously specified frequencies, but may be designed to be variable in order to measure a PIM characteristic for each frequency band in the DAS. To this end, each of the first and second test signal generators 112 and 114 may have a frequency variable module for enabling the selection of a frequency of a continuous wave to be generated therefrom. Accordingly, each of the first and second test signal generators 112 and 114 may receive a frequency variable selection command of the controller 130 and generate a continuous wave having a frequency corresponding to the selection command of the controller 130.

As described above, if a two-tone continuous wave having the first and second frequencies respectively selected from the first and second test signal generators 112 and 114 is generated, the controller 130 controls on/off operations of the first and second on/off switches 116 and 118, so that the two-tone continuous wave is changed into a pulse signal (i.e., a two-tone pulse signal). In this state, the on/off control time may be synchronized at a time when the PIM measurement is required (a time when the transmission of the two-tone pulse signal is required). The on/off times of the first and second on/off switches 116 and 118 may be controlled to be the same time. It will be apparent that the on/off times of both the switches 116 and 118 are not necessarily the same, and may be switches at an interval of a predetermined time within a range where there is no problem in the PIM measurement according to a design implementing method.

The two-tone pulse signal generated as described above is propagated to the distribution network and the installation equipments in the DAS via a signal multiplexer 16 in a signal transmission and reception unit 14. In the above, the case where the two-tone pulse signal is generated from the continuous wave by a configuration circuit shown in FIG. 3 has been illustrated, but the two-tone pulse generation unit 110 according to the embodiment of the inventive concept is not necessarily limited to the configuration described above. It will be apparent that the two-tone pulse signal may be initially generated as a pulse signal having a frequency different from that thereof.

If the generated two-tone pulse signal is propagated to the distribution network and the installation equipments in the DAS, a spurious signal (i.e., an IM signal) is generated in a passive element having an inferior PIM characteristic with respect to the frequency of the propagated two-tone pulse signal in the distribution network and the installation equipments. The spurious signal is fed back in the form of a reflected wave to the relay unit. The IM signal fed back as described above is detected by the PIM detection unit 120, and the controller 130 may identify the generation position and characteristic of a PIM by analyzing the detected IM signal. For example, the controller 130 may measure a time required from the time when the two-tone pulse signal is generated or propagated to the time when the fed-back IM signal is received or detected, and calculate a distance corresponding to the measured time, thereby identifying the generation position of the PIM. To this end, the controller 130 may measure the time required until the IM signal is fed back by driving a time counter (i.e., a timer) from the time when the two-tone pulse signal is generated or propagated.

In this state, whether the signal received to the relay unit is an IM signal is determined by the following Equation 1. In the following Equation 1, $f_1$ and $f_2$ are frequencies of the two-tone pulse signal, and M and N may be natural numbers. It will be apparent that any one of the M and N may have a value of zero within the limits where both the M and N have values that are not zero.

$$\text{Frequency of IM signal} = Mf_1 \pm Nf_2 \quad \quad \text{Equation 1}$$

This has been illustrated in FIG. 4. Referring to FIG. 4, IM signals of various degrees (Here, the degrees means values of M+N) may be generated according to values of the M and N. However, the IM signal necessary for analysis in an actual DAS is an IM signal generated in an Rx band of the relay unit (i.e., received through the Rx band). This is because the IM signals of the other degrees are removed by a filter. Therefore, the controller 130 may decide a PIM characteristic based on the IM signals fed back (i.e., received through the Rx band). In this case, the controller 130 may decide a PIM characteristic based on the largest signal among the fed-back IM signals.

In order to perform the PIM measurement described above, the controller 130 may propagate the two-tone pulse signal in an idle period where the relay unit having the PIM measurement device 100 included therein does not provide any relay service, and control the PIM measurement to be performed. Alternatively, the controller 130 may transmit a service pause command to the relay unit so that the relay service is paused during a test period of the PIM measurement according to the two-tone pulse signal. This is because, if the PIM measurement is performed when the relay unit provides the relay service, a service signal and a PIM signal may be mixed, or it may be difficult to exactly detect power of the PIM signal.

However, the PIM measurement is not necessarily performed in a service idle period, etc, and may be performed during the relay service. That is, the controller 130 may perform the PIM measurement when the relay unit provides the relay service. In this case, the controller may perform the PIM measurement even when the relay unit provides the relay service in such a manner that selects two frequencies to be used in the two-tone pulse signal, so that the IM signal detected by the PIM detection unit 120 may have a frequency not overlapped with a service frequency band used by the relay service according to Equation 1 described above. This has been illustrated in FIG. 5.

Figure 5:
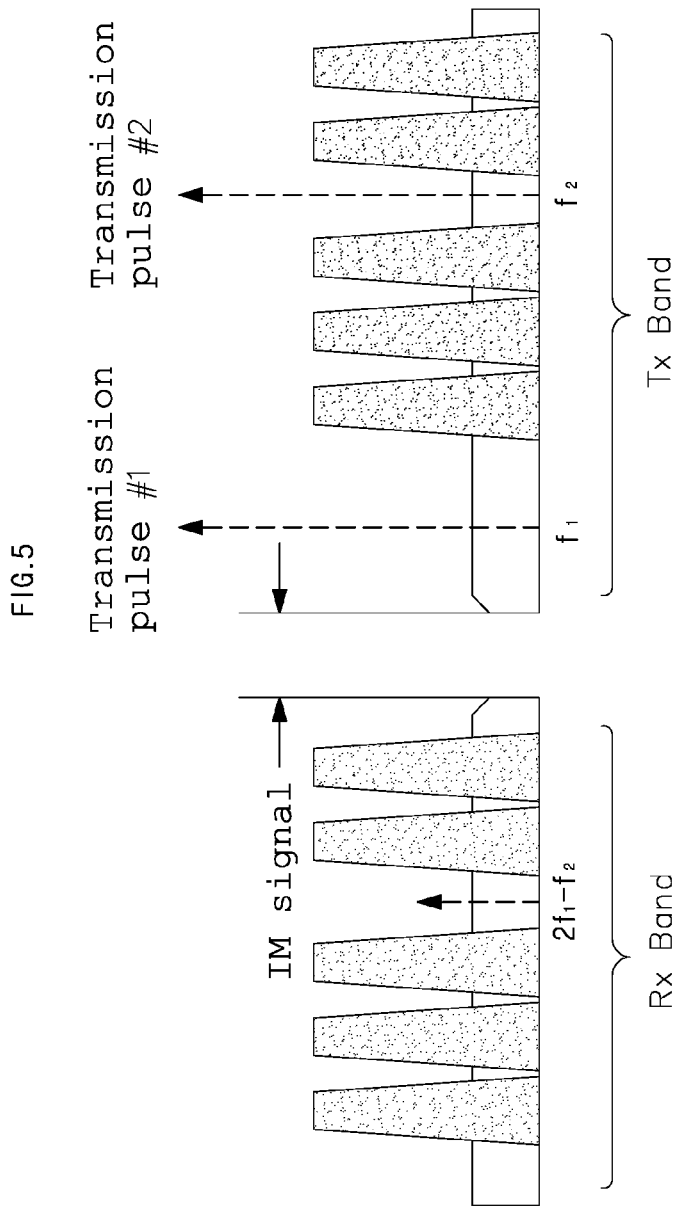
FIG. 5 is a diagram illustrating a method for selecting a frequency of the two-tone pulse signal when assuming that the measurement of a PIM is performed together with a service signal of the relay unit.

Referring to FIG. 5, an IM signal frequency is assumed which can be fed back without being overlapped with a signal related to the service, received through the Rx band of the relay unit. The IM signal frequency is reciprocally calculated using Equation 1, thereby selecting frequencies of the two-tone pulse signal.

Figure 6:
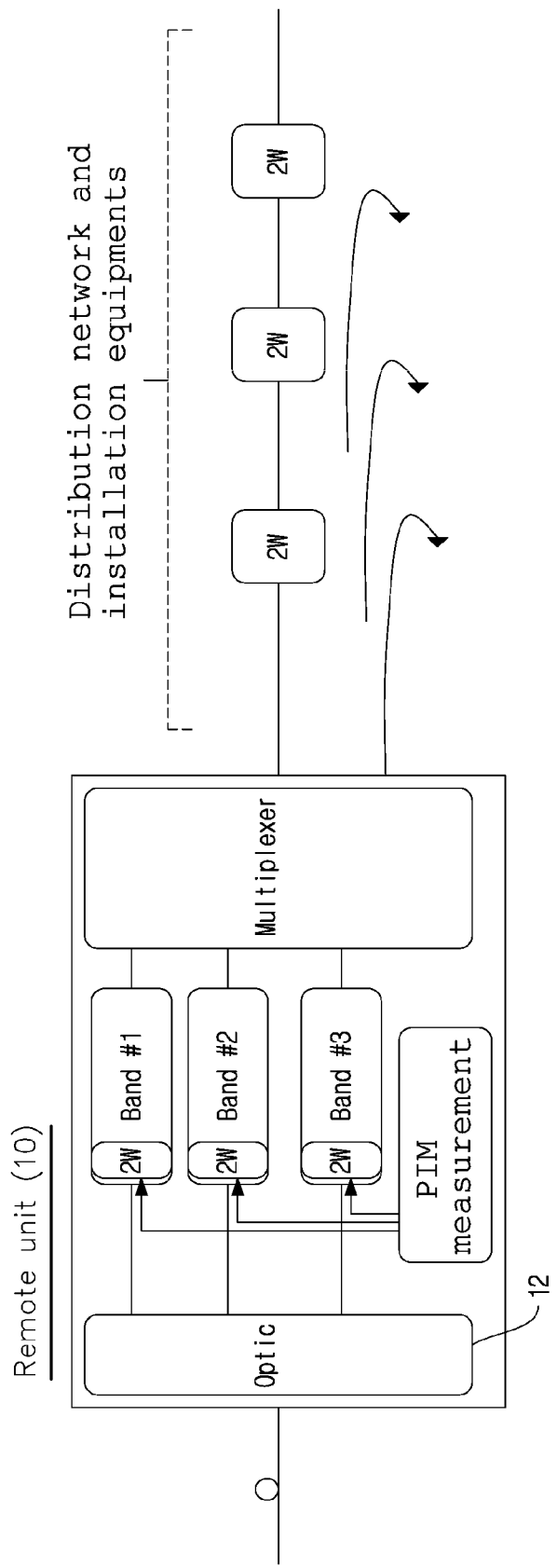
FIG. 6 is an exemplary diagram illustrating a plan for measuring a PIM for each frequency band in a remote unit for providing a multiband service.

The PIM measurement method described above may be extended using a method of extending a multi-frequency band (i.e., a multi-service band) or a method of allowing a PIM measurement device to be included in a donor unit and performing PIM measurement for each of a plurality of remote units to be connected to the donor unit. This has been illustrated in FIGS. 6 and 7. FIG. 6 is an exemplary diagram illustrating a plan for measuring a PIM for each frequency band in a remote unit for providing a multiband service. FIG. 7 is an exemplary diagram illustrating a plan for measuring a PIM in a distribution network and installation equipments within the DAS when assuming that the PIM measurement device is included in a donor unit.

Referring to FIG. 6, the remote unit 10 having the PIM measurement device 100 included therein provides a multiband service. Here, reference numeral 12 of FIG. 6 is an optical module. In this case, in order to perform PIM measurement in a distribution network or installation equipments installed in the distribution network for each frequency of a multiband, the controller 130 of the PIM measurement device 100 changes and generates a two-tone pulse signal suitable for each frequency band of the multiband by controlling operations of the first and second test signal generators, and accordingly, the PIM measurements for the frequency bands can be sequentially performed. The reason why the PIM measurement is separately performed for each frequency band of the multiband as described above is that PIM characteristics of passive elements installed in the distribution network and installation equipments may be different for each corresponding frequency band.

Referring to FIG. 7, a case is illustrated where the PIM measurement device 100 is included in the donor unit 20. In the case of FIG. 7, in order to perform PIM measurement of an antenna distribution network connected to each of a plurality of remote units and installation equipments installed in the antenna distribution network, (the controller 130 of) the PIM measurement device 100 may generate a two-tone pulse signal necessary for each remote unit and sequentially transmit the generated two-tone pulse signals to the respective remote units. Accordingly, the PIM measurement for each remote unit can be performed based on IM signals fed back. In this state, a 1×N switch 26 may be used in switching for subsequent PIM measurements for the respective remote units.

While the inventive concept has been described with respect to the specific embodiments, it will be apparent to those skilled in the art that various changes and modifications may be made without departing from the spirit and scope of the invention as defined in the following claims.

What is claimed:

1. A passive intermodulation (PIM) measurement device included in a unit of a distributed antenna system (DAS), the PIM measurement device comprising:
    a memory to store instructions; and
    a processor, coupled to the memory, to facilitate execution of the instructions to perform operations, comprising:
        generating a coded signal including two-tone pulse having frequencies different from each other;
        measuring a first time when the coded signal is generated or propagated to at least one of installation equipment and a distribution network;
        measuring a second time when an intermodulation (IM) signal is detected, wherein the IM signal is fed back from the at least one of installation equipment and the distribution network, corresponding to the propagation of the coded signal;
        calculating a distance corresponding to a time difference between the first time and the second time;
        determining a PIM location based on the calculated distance; and
        generating PIM information associated with the PIM location based on the determined PIM location.

2. The PIM measurement device of claim 1, wherein the operations further comprise:
    generating a first continuous wave having a first frequency;
    converting the first continuous wave into a first pulse of the coded signal;
    generating a second continuous wave having a second frequency different from the first frequency; and
    converting the second continuous wave into a second pulse of the coded signal.

3. The PIM measurement device of claim 2, wherein the operations further comprise:
    selecting a frequency of a continuous wave to be generated; and
    generating continuous waves corresponding to two frequencies in a frequency band necessary for PIM measurement.

4. The PIM measurement device of claim 1, wherein the operations further comprise:
    detecting the IM signal having a frequency corresponding to Equation 1: frequency of IM signal=$Mf1\pm Nf2$, wherein f1 and f2 are frequencies of the coded signal, and M and N are natural numbers;
    detecting a PIM characteristic based on an IM signal having the largest signal magnitude among a plurality of IM signals; and
    generating the PIM information associated with the PIM characteristic.

5. The PIM measurement device of claim 1, wherein the operations are to be operating during an idle period in which unit of the DAS does not provide a relay service, or transmits a service pause command to the unit of the DAS so that the relay service is paused during a PIM test period.

6. The PIM measurement device of claim 1, wherein, when the unit of the DAS provides a multiband service, the operations are to be PIM measurements for each band pertaining to the multiband service sequentially.

7. The PIM measurement device of claim 6, wherein the operations further comprise generating the PIM information for each band pertaining to the multiband service.

8. The PIM measurement device of claim 1, wherein the operations further comprise generating the coded signal such that the frequencies of the coded signal do not overlap a frequency of a relay service while the unit of the DAS provides the relay service.

9. The PIM measurement device of claim 1, wherein the operations further comprise:
    generating the coded signal necessary for each of a plurality of remote units in the DAS when the unit is a donor unit connected to the plurality of remote units; and
    sequentially transmitting the generated coded signal to the remote units so that PIM measurements in an antenna distribution network connected to the remote units and installation equipment installed in the antenna distribution network are possible.

10. A passive intermodulation (PIM) measurement method comprising:
    generating a coded signal including two-tone pulse having frequencies different from each other;
    measuring a first time when the coded signal is generated or propagated to at least one of installation equipment and a distribution network;
    measuring a second time when an intermodulation (IM) signal is detected, wherein the IM signal is fed back from the at least one of installation equipment and the distribution network, corresponding to the propagation of the coded signal;
    calculating a distance corresponding to a time difference between the first time and the second time;
    determining a PIM location based on the calculated distance; and generating PIM information associated with the PIM location based on the determined PIM location.

11. The PIM measurement method of claim 10, wherein the generating the coded signal further comprises:
   generating a first continuous wave having a first frequency;
   converting the first continuous wave into a first pulse of the coded signal;
   generating a second continuous wave having a second frequency different from the first frequency; and
   converting the second continuous wave into a second pulse of the coded signal.

12. The PIM measurement method of claim 11, wherein the generating the coded signal further comprises:
   selecting a frequency of a continuous wave to be generated; and
   generating continuous waves corresponding to two frequencies in a frequency band necessary for PIM measurement.

13. The PIM measurement method of claim 10, wherein the generating PIM information further comprises:
   detecting the IM signal having a frequency corresponding to Equation 1: frequency of IM signal=$Mf1 \pm Nf2$, wherein f1 and f2 are frequencies of the coded signal, and M and N are natural numbers;
   detecting a PIM characteristic based on an IM signal having the largest signal magnitude among a plurality of IM signals; and
   generating the PIM information associated with the PIM characteristic.

14. The PIM measurement method of claim 10, wherein the method is to be operating during an idle period in which unit of a distributed antenna system (DAS) does not provide a relay service, or transmits a service pause command to the unit of the DAS so that the relay service is paused during a PIM test period.

15. The PIM measurement method of claim 10, wherein, when a unit of a distributed antenna system (DAS) provides a multiband service, the method is to be PIM measurements for each band pertaining to the multiband service sequentially.

16. The PIM measurement method of claim 15, wherein the generating PIM information further comprises generating the PIM information for each band pertaining to the multiband service.

17. The PIM measurement method of claim 10, wherein the generating a coded signal further comprises generating the coded signal such that the frequencies of the coded signal do not overlap a frequency of a relay service while a unit of a distributed antenna system (DAS) provides the relay service.

18. The PIM measurement method of claim 10, wherein the generating a coded signal further comprises generating the coded signal necessary for each of a plurality of remote units in a distributed antenna system (DAS) when the unit is a donor unit connected to the plurality of remote units.

19. The PIM measurement method of claim 18, further comprises sequentially transmitting the generated coded signal to the remote units so that PIM measurements in an antenna distribution network connected to the remote units and installation equipment installed in the antenna distribution network are possible.

* * * * *